(12) United States Patent
Mei et al.

(10) Patent No.: US 12,464,888 B2
(45) Date of Patent: Nov. 4, 2025

(54) QUANTUM DOT LIGHT EMITTING DIODE, MANUFACTURING METHOD THEREOF AND DISPLAY APPARATUS

(71) Applicant: BOE TECHNOLOGY GROUP CO., LTD., Beijing (CN)

(72) Inventors: Wenhai Mei, Beijing (CN); Yichi Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1158 days.

(21) Appl. No.: 17/419,820

(22) PCT Filed: Sep. 23, 2020

(86) PCT No.: PCT/CN2020/117077
§ 371 (c)(1),
(2) Date: Jun. 30, 2021

(87) PCT Pub. No.: WO2022/061574
PCT Pub. Date: Mar. 31, 2022

(65) Prior Publication Data
US 2022/0320454 A1    Oct. 6, 2022

(51) Int. Cl.
*H10K 50/16* (2023.01)
*H10K 50/115* (2023.01)
*H10K 71/00* (2023.01)
*H10K 71/40* (2023.01)
*H10K 102/00* (2023.01)

(52) U.S. Cl.
CPC ......... *H10K 50/166* (2023.02); *H10K 50/115* (2023.02); *H10K 50/16* (2023.02); *H10K 71/00* (2023.02); *H10K 71/40* (2023.02); *H10K 2102/00* (2023.02); *H10K 2102/351* (2023.02)

(58) Field of Classification Search
CPC .... H10K 50/16; H10K 50/115; H10K 50/166; H10K 50/167; H10K 50/181; H10K 59/351–353
See application file for complete search history.

(56) References Cited

U.S. PATENT DOCUMENTS

2007/0158615 A1* 7/2007 Ohashi ................. C09K 11/623
                                                    252/301.6 R
2008/0226220 A1* 9/2008 Forbes ................... B82Y 20/00
                                                    385/39

(Continued)

*Primary Examiner* — Matthew C Landau
*Assistant Examiner* — Halee Cramer
(74) *Attorney, Agent, or Firm* — HOUTTEMAN LAW LLC

(57) ABSTRACT

The present disclosure provides a quantum dot light emitting diode, including: a first electrode, a second electrode, a quantum dot light emitting layer between the first electrode and the second electrode, an electron transport layer between the quantum dot light emitting layer and the first electrode, and an electron buffer layer between the electron transport layer and the quantum dot light emitting layer; wherein the electron transport layer and the electron buffer layer include a same metal oxide, and an oxygen vacancy concentration in the electron buffer layer is greater than that in the electron transport layer. The embodiment of the present disclosure also provides a manufacturing method for the quantum dot light emitting diode and a display apparatus.

5 Claims, 5 Drawing Sheets

(56) References Cited

U.S. PATENT DOCUMENTS

| | | | | |
|---|---|---|---|---|
| 2019/0326535 A1* | 10/2019 | Kim | ...................... | H10K 59/122 |
| 2020/0083470 A1* | 3/2020 | Chung | .................. | H10K 50/115 |
| 2020/0328368 A1* | 10/2020 | Chung | .................. | H10K 50/115 |
| 2021/0098729 A1* | 4/2021 | Ueta | ..................... | H10K 50/156 |
| 2023/0023531 A1* | 1/2023 | Ma | ........................... | B01J 13/06 |
| 2023/0180604 A1* | 6/2023 | Ahn | ..................... | C07D 413/04 |
| | | | | 428/690 |
| 2024/0010512 A1* | 1/2024 | Wu | ......................... | C01G 9/02 |

* cited by examiner

QUANTUM DOT LIGHT EMITTING DIODE, MANUFACTURING METHOD THEREOF AND DISPLAY APPARATUS

TECHNICAL FIELD

The present disclosure relates to the field of display technology, and in particular to a quantum dot light emitting diode, a manufacturing method thereof and a display apparatus.

BACKGROUND

A Quantum Dot Light Emitting Diode (QLED) generally includes a light emitting layer having a plurality of quantum dot nanocrystals sandwiched between an electron transport layer and a hole transport layer. An electric field is applied to the quantum dot light emitting diode, causing electrons and holes to move into the light emitting layer where they are trapped in quantum dots and recombined, to emit photons. Compared with an organic light emitting diode, an emission spectrum of the quantum dot light emitting diode is narrower.

SUMMARY

The present disclosure provides a quantum dot light emitting diode, a manufacturing method thereof and a display apparatus.

In a first aspect, an embodiment of the present disclosure provides a quantum dot light emitting diode, including: a first electrode, a second electrode, a quantum dot light emitting layer between the first electrode and the second electrode, an electron transport layer between the quantum dot light emitting layer and the first electrode, and an electron buffer layer between the electron transport layer and the quantum dot light emitting layer; wherein the electron transport layer and the electron buffer layer include a same metal oxide, and an oxygen vacancy concentration in the electron buffer layer is greater than that in the electron transport layer.

In some embodiments, the metal oxide includes: at least one of zinc oxide, magnesium zinc oxide, aluminum zinc oxide and magnesium aluminum zinc oxide.

In some embodiments, the oxygen vacancy concentration in the electron buffer layer includes: 5% to 50%.

In some embodiments, a thickness of the electron buffer layer includes: 0.5 nm to 10 nm.

In some embodiments, a thickness of the electron transport layer includes: 1 nm to 100 nm.

In some embodiments, the metal oxide of the electron transport layer has a crystalline structure; and the metal oxide of the electron buffer layer has a non-crystalline structure.

In some embodiments, an electron binding energy of metal atoms in the metal oxide of the electron transport layer is greater than that of metal atoms in the metal oxide of the electron buffer layer;

an electron binding energy of oxygen atoms in the metal oxide of the electron transport layer is less than that of oxygen atoms in the metal oxide of the electron buffer layer.

In some embodiments, the quantum dot light emitting diode further includes a base substrate, a hole transport layer, and a hole injection layer;

the first electrode, the electron transport layer, the electron buffer layer, the quantum dot light emitting layer, the hole transport layer, the hole injection layer and the second electrode are sequentially provided along a direction distal to the base substrate; or the first electrode, the electron transport layer, the electron buffer layer, the quantum dot light emitting layer, the hole transport layer, the hole injection layer and the second electrode are sequentially provided along a direction proximal to the base substrate.

In a second aspect, an embodiment of the present disclosure further provides a method for manufacturing the quantum dot light emitting diode as provided in the first aspect, including: forming a first electrode, a second electrode, a quantum dot light emitting layer, an electron transport layer, and an electron buffer layer, wherein the quantum dot light emitting layer is provided between the first electrode and the second electrode, the electron transport layer is provided between the first electrode and the quantum dot light emitting layer, the electron buffer layer is provided between the electron transport layer and the quantum dot light emitting layer;

wherein the electron transport layer and the electron buffer layer include a same metal oxide, and an oxygen vacancy concentration in the electron buffer layer is greater than that in the electron transport layer.

In some embodiments, the step of forming a first electrode, a second electrode, a quantum dot light emitting layer, an electron transport layer, and an electron buffer layer includes: forming the first electrode; forming the electron transport layer and the electron buffer layer on a side of the first electrode such that the electron buffer layer is provided on a side of the electron transport layer distal to the first electrode; forming the quantum dot light emitting layer on a side of the electron buffer layer distal to the first electrode; and forming the second electrode on a side of the quantum dot light emitting layer distal to the first electrode.

In some embodiments, the step of forming the electron transport layer and the electron buffer layer on a side of the first electrode includes:

forming a thin film of metal oxide material on the side of the first electrode;

treating a surface portion on a side of the thin film of metal oxide material distal to the first electrode using a predetermined surface treatment process, to increase a concentration of oxygen defects in the surface portion such that the surface portion is the electron buffer layer, and a portion of the thin film of metal oxide material, which is not treated by acidic solution, is the electron transport layer.

In some embodiments, the step of treating a surface portion on a side of the thin film of metal oxide material distal to the first electrode using a predetermined surface treatment process includes:

treating the surface portion on the side of the thin film of metal oxide material distal to the first electrode with an acidic solution having a pH range including: 4 to 6.

In some embodiments, the step of treating the surface portion on the side of the thin film of metal oxide material distal to the first electrode with the acidic solution includes:

immersing the thin film of metal oxide material in the acidic solution for a predetermined period of time.

In some embodiments, the step of forming the electron transport layer and the electron buffer layer on a side of the first electrode includes:

mixing a metal salt solution for forming the thin film of metal oxide material with a photoacid generator to form a mixed solution;

coating the mixed solution on the first electrode;

irradiating a portion of the mixed solution distal to the first electrode and having a predetermined thickness, by an irradiation process, such that the photoacid generator in the irradiated portion generates an acid.

performing a baking and annealing process on the mixed solution to form the thin film of metal oxide material such that the portion of the thin film of metal oxide material distal to the first electrode is the electron buffer layer, and the other portion is the electron transport layer.

In some embodiments, the step of forming a first electrode, a second electrode, a quantum dot light emitting layer, an electron transport layer and an electron buffer layer includes:

forming the second electrode;

forming the quantum dot light emitting layer on the second electrode;

forming the electron transport layer and the electron buffer layer on a side of the quantum dot light emitting layer distal to the second electrode such that the electron transport layer is provided on a side of the electron buffer layer distal to the first electrode; and forming the first electrode on a side of the electron transport layer distal to the second electrode.

In some embodiments, the step of forming the electron transport layer and the electron buffer layer on a side of the quantum dot light emitting layer distal to the second electrode includes:

mixing a metal salt solution for forming the thin film of metal oxide material with a photoacid generator to form a mixed solution;

coating the mixed solution on the side of the quantum dot light emitting layer distal to the second electrode;

irradiating a portion of the mixed solution proximal to the second electrode and having a predetermined thickness, by an irradiation process, such that the photoacid generator in the irradiated portion generates an acid; and performing a baking and annealing process on the mixed solution to form the thin film of metal oxide material such that the portion of the thin film of metal oxide material proximal to the second electrode is the electron buffer layer, and the other portion is the electron transport layer.

In a third aspect, an embodiment of the present disclosure further provides a display apparatus, including: the quantum dot light emitting diode as provided in the first aspect.

DETAIL DESCRIPTION OF EMBODIMENTS

Figure 1:
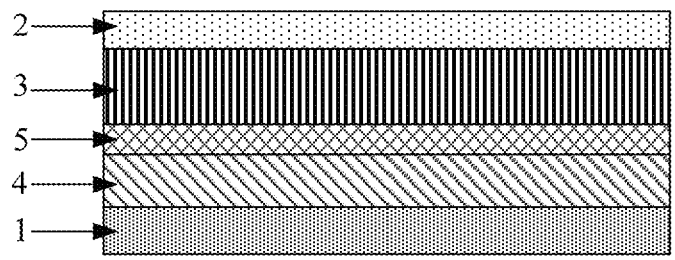
FIG. 1 is a schematic structural diagram of a quantum dot light emitting diode according to an embodiment of the present disclosure.

To enable one of ordinary skill to better understand technical solutions of the present disclosure, a quantum dot light emitting diode, a manufacturing method thereof, and a display apparatus provided in the present disclosure will be described in detail below with reference to the accompanying drawings.

Technical or scientific terms used in the present disclosure should be given their ordinary meanings as understood by one of ordinary skill in the art to which the present disclosure belongs. The use of words "first", "second", and the like in the present disclosure is not intended to indicate any order, quantity, or importance, but rather is used to distinguish one element from another. Also, the use of words "a", "an" or "the" and the like does not indicate a limitation of quantity, but rather indicates the presence of at least one. The use of words "comprising" or "including", and the like means that an element or item preceding the word includes an element or item listed after the word and its equivalent, but does not exclude other elements or items. Words "connected" or "coupled" and the like are not restricted to physical or mechanical connections, but may include electrical connections, whether direct or indirect. Words "upper", "lower", "left", "right", and the like are used only to indicate relative positional relationships, and when an absolute position of an object being described is changed, the relative positional relationships may also be changed accordingly.

A basic structure of a light emitting device includes: an anode, a cathode, and a light emitting layer between the anode and the cathode. Under the action of an external voltage, electrons and holes are injected from the cathode and the anode, respectively, then are migrated, and are encountered and recombined in the light emitting layer such that excitons are generated, and the energy of the excitons is attenuated in the form of light. That is, the light is radiated. When the light emitting device is a quantum dot light emitting diode, the light emitting layer is a quantum dot light emitting layer; the quantum dot light emitting layer is made of quantum dots as the name implies.

The light emitting device may be an upright light emitting device or an inverted light emitting device. The light emitting device generally includes a base substrate, and the anode is closer to the base substrate than the cathode for the upright light emitting device; the cathode is closer to the base substrate than the anode for the inverted light emitting device. Regardless of whether the light emitting device is the upright light emitting device or the inverted light emitting device, the light emitting device may be a top emission type light emitting device or a bottom emission type light emitting device. When the light emitting device is an upright top emission type light emitting device, the anode is a reflective electrode and the cathode is a transparent electrode; when the light emitting device is an upright bottom emission type light emitting device, the anode is a transparent electrode and the cathode is a reflective electrode; when the light emitting device is an inverted top emission type light emitting device, the anode is a transparent electrode and the cathode is a reflective electrode; when the light emitting device is an inverted bottom emission type light emitting device, the anode is a reflective electrode and the cathode is a transparent electrode.

With a continuous optimization for the performance of the light emitting device, the light emitting device includes an anode layer, a cathode layer and a light emitting layer; further includes a Hole Injection Layer (HIL), a Hole Transport Layer (HTL) disposed between the anode layer and the light emitting layer, and an Electron Transport Layer (ETL) disposed between the cathode layer and the light emitting layer. Further, an Electron Injection Layer (EIL) may be disposed between the Electron transport Layer and the cathode layer.

Inorganic metal oxides (e.g., zinc oxide) are commonly used to form an electron transport layer, and the electron transport layer formed has a relatively high electron transport rate (typically 200 $cm^2V^{-1}s^{-1}$ to 300 $cm^2V^{-1}s^{-1}$). In a QLED device including an electron transport layer, the problem of low luminous efficiency of the device caused by an unbalanced transport of carriers exists conventionally. The main reason is that the electron transport capacity of the existing electron transport layer is too strong, so that the electron transport rate is often greater than a hole transport rate, which may cause a phenomenon of an unbalanced injection of carriers, and further cause an excessive accumulation of electrons in the quantum dot light emitting layer, thereby affecting the device performance.

At present, in order to overcome the problem of the unbalanced transport of carriers due to a too high electron transport rate of the electron transport layer, an electron buffer layer is generally added between the electron transport layer and the quantum dot light emitting layer to reduce the electron transport rate in the QLED device. Generally, the electron buffer layer is made of organic material (such as polymethyl methacrylate) or inorganic insulating material (such as magnesium fluoride, aluminum fluoride, silicon dioxide). At this time, although the problem of the unbalanced injection of carriers may be solved, one process step for depositing an organic material thin film or an inorganic insulating material thin film is required to be added at least between existing process steps for forming the electron transport layer and for forming the quantum dot light emitting layer, to form the electron buffer layer, which may lead to the complication of the procedure for forming the QLED device. In addition, an additional apparatus for forming a thin film of the electron buffer layer is also required to be added in a production line, resulting in a significant increase in production cost.

In order to solve the technical problem, the embodiment of the present disclosure provides a quantum dot light emitting diode, a manufacturing method thereof, and a display apparatus.

FIG. 1 is a schematic structural diagram of a quantum dot light emitting diode according to an embodiment of the present disclosure. As shown in FIG. 1, the quantum dot light emitting diode includes: a first electrode 1, a second electrode 2, a quantum dot light emitting layer 3, an electron transport layer 4 and an electron buffer layer 5; the quantum dot light emitting layer 3 is provided between the first electrode 1 and the second electrode 2, the electron transport layer 4 is provided between the quantum dot light emitting layer 3 and the first electrode 1, and the electron buffer layer 5 is provided between the electron transport layer 4 and the quantum dot light emitting layer 3; the electron buffer layer 5 is configured to reduce an electron transport rate in the QLED device, so that a difference between the electron transport rate and a hole transport rate in the QLED device is within a preset threshold range, and a balance between holes and electrons in the quantum dot light emitting layer 3 is facilitated.

In the embodiment of the present disclosure, the first electrode 1 functions as a cathode and the second electrode 2 functions as an anode.

The electron transport layer 4 and the electron buffer layer 5 include the same metal oxide, and an oxygen vacancy concentration in the electron buffer layer 5 is greater than that in the electron transport layer 4. "The electron transport layer 4 and the electron buffer layer 5 include the same metal oxide" specifically means that the metal oxide in the electron transport layer 4 and the metal oxide in the electron buffer layer 5 have the same composition element and the same ratio of the elements, that is, the same molecular formula.

The oxygen vacancy concentration is a ratio of the number of oxygen ion vacancies per unit volume to the number of nodes of all oxygen ions in that volume. Generally, for the same thin film of metal oxide material, the greater the oxygen vacancy concentration in the thin film of metal oxide material is, the smaller the electron transport rate thereof is, and a specific principle will be exemplarily described later. Therefore, in the embodiment of the present disclosure, the electron transport rate of the electron buffer layer 5 is smaller than that of the electron transport layer 4, and the electron buffer layer 5 may be configured to reduce the electron transport rate in the QLED device. The electron transport rate of the electron buffer layer 5 is controlled, such that the electron injection rate of the quantum dot light emitting layer 3 may be controlled, the balance between holes and electrons in the quantum dot light emitting layer 3 is realized, and the luminous efficiency of the QLED device is improved.

In the embodiment of the present disclosure, since the electron transport layer 4 and the electron buffer layer 5 include the same metal oxide, the thin film of metal oxide for forming the electron buffer layer 5 may be produced by using an existing equipment for forming the electron transport layer 4. Therefore, an additional equipment specially used for forming the thin film of the electron buffer layer 5 is required to be added in the production line, which is beneficial to reducing the production cost. In addition, the thin film of metal oxide for forming the electron transport layer 4 and the thin film of metal oxide for forming the electron buffer layer 5 may be formed simultaneously (in the same process), which is beneficial to reducing process steps and simplifying the production process for the QLED device.

In some embodiments, the metal oxide includes: at least one of zinc oxide, magnesium zinc oxide, aluminum zinc oxide and magnesium aluminum zinc oxide.

In some embodiments, a thickness of the electron transport layer 4 includes: 1 nm to 100 nm.

In some embodiments, the oxygen vacancy concentration in the electron buffer layer 5 includes: 5% to 50%. In general, the larger the oxygen vacancy concentration of the electron buffer layer 5 is, the smaller the electron transport rate of the electron buffer layer 5 is, and the smaller the electron injection rate of the quantum dot light emitting layer 3 is.

In some embodiments, a thickness of the electron buffer layer 5 includes: 0.5 nm to 10 nm. In general, the larger the thickness of the electron buffer layer 5 is, the smaller the electron transport rate of the electron buffer layer 5 is, and the smaller the electron injection rate of the quantum dot light emitting layer 3 is.

In practical applications, the oxygen vacancy concentration and the thickness of the electron buffer layer 5 may be set according to the hole injection rate of the quantum dot light emitting layer 3 and the electron transport rate of the electron transport layer 4.

In some embodiments, the metal oxide in the electron transport layer has a crystalline structure; the metal oxide in the electron buffer layer has a noncrystalline structure.

In some embodiments, an electron binding energy of metal atoms in the metal oxide in the electron transport layer is greater than that of metal atoms in the metal oxide in the electron buffer layer; an electron binding energy of oxygen atoms in the metal oxide in the electron transport layer is less than that of oxygen atoms in the metal oxide in the electron buffer layer.

The structure of the metal oxide and the electron binding energy of atoms in the electron transport layer and the electron buffer layer will be described in detail later with specific examples.

Figure 2:
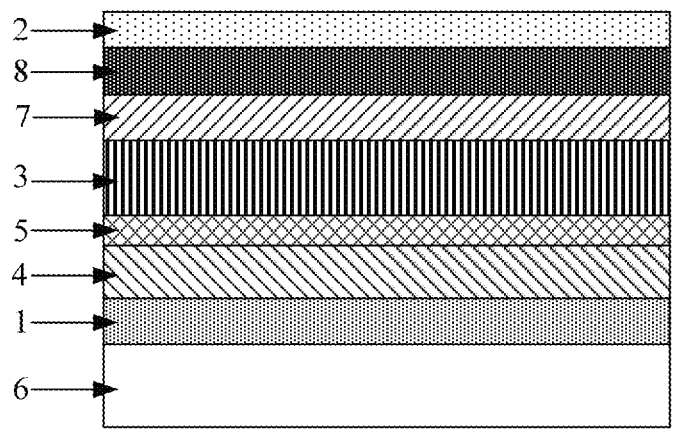
FIG. 2 is a schematic structural diagram of a quantum dot light emitting diode according to an embodiment of the present disclosure.

FIG. 2 is a schematic structural diagram of another quantum dot light emitting diode according to an embodiment of the present disclosure. As shown in FIG. 2, the QLED device includes not only a first electrode 1, a second electrode 2, a quantum dot light emitting layer 3, an electron transport layer 4, and an electron buffer layer 5, but also a base substrate 6, a hole transport layer 7, and a hole injection layer 8. The first electrode 1, the electron transport layer 4, the electron buffer layer 5, the quantum dot light emitting layer 3, the hole transport layer 7, the hole injection layer 8 and the second electrode 2 are sequentially provided along a direction distal to the base substrate 6.

It is noted that in the QLED device shown in FIG. 2, the first electrode 1 is a cathode and the second electrode 2 is an anode, and the QLED device is an inverted QLED device.

Figure 3:
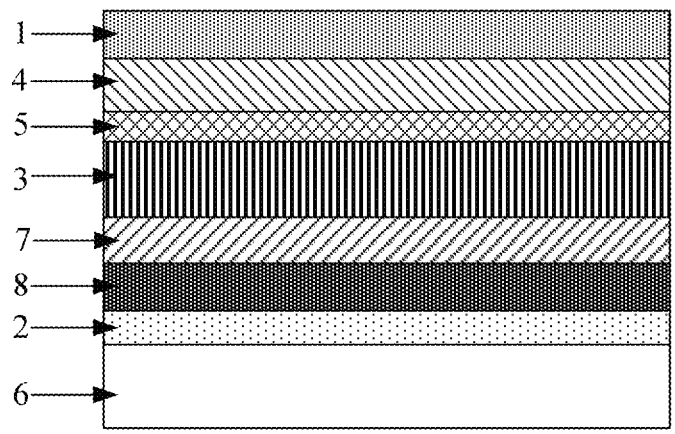
FIG. 3 is a schematic structural diagram of a quantum dot light emitting diode according to an embodiment of the present disclosure.

FIG. 3 is a schematic structural diagram of yet another quantum dot light emitting diode according to an embodiment of the present disclosure. As shown in FIG. 3, the QLED device in the embodiment of the present disclosure is an upright QLED device, unlike the QLED device shown in FIG. 2 which is an inverted QLED device. The first electrode 1, the electron transport layer 4, the electron buffer layer 5, the quantum dot light emitting layer 3, the hole transport layer 7, the hole injection layer 8 and the second electrode 2 are sequentially provided along a direction proximal to the base substrate 6.

In the embodiment of the present disclosure, a material of the anode includes, but is not limited to, a metal material having a high work function (e.g., gold, copper, silver, platinum, etc.), an inorganic metal oxide having a certain conductivity (e.g., indium tin oxide, zinc oxide, etc.), or an organic conductive polymer (e.g., poly 3,4-ethylenedioxythiophene/polystyrene sulfonate PEDOT: PSS, polyaniline PANI, etc.).

A material of the cathode includes, but is not limited to, a metal material having a low work function (e.g., lithium, magnesium, calcium, strontium, aluminum, indium, etc.), an alloy material made of the above metal having the low work function with copper, gold, silver, or an inorganic metal oxide having a certain conductivity (e.g., indium tin oxide, zinc oxide, etc.).

A material of the hole injection layer 8 includes, but is not limited to, poly (3,4-ethylenedioxythiophene) polystyrene sulfonate (PEDOT: PSS), polythiophene, polyaniline, polypyrrole, copper phthalocyanine and 4,4,4"-tris (N,N-phenyl-3-methylphenylamino) triphenylamine (m-MTDATA), molybdenum oxide, copper phthalocyanine or poly (3,4-ethylenedioxythiophene) polystyrene sulfonate (PEDOT: PSS).

A material of the hole transport layer 7 includes, but is not limited to, p-type polymer materials and various p-type materials having a low molecular weight, for example, polythiophene, polyaniline, polypyrrole, and a mixture having poly-3,4-ethylenedioxythiophene and poly (sodium p-styrenesulfonate), 4,4'-cyclohexylidene bis [N,N-bis (4-methylphenyl) aniline (TAPC), or 4,4',4"-tris (N-carbazolyl) triphenylamine (TCTA), N,N'-bis (1-naphthyl)-N,N'-diphenylbenzidine (NPB).

A material of the quantum dot light emitting layer 3 includes, but is not limited to, various perovskite type quantum dots, specifically, includes: (1) lead-containing perovskite-type quantum dots, such as organic-inorganic lead halide $MAPbX_3$ quantum dots; all-inorganic cesium-lead halide $CsPbX_3$ quantum dots, and rare earth ion (lanthanum, samarium, uranium and the like) doped $MAPbX_3$ quantum dots or $CsPbX_3$ quantum dots and the like, wherein MA is $CH_3NH_3$, and X is any one of Cl, Br and I; (2) perovskite-type quantum dots containing at least one of bismuth group, tin group and silver group, such as $CsSnX_3$ quantum dots, $CsSbX_3$ quantum dots, $Cs_2SnX_6$ quantum dots, Cs2AgInCl$_6$ quantum dots, $CH_3NH_3SbX_3$ quantum dots, $CH_3NH_3SnX_3$ quantum dots and the like; wherein, X is any one of Cl, Br and I. Alternatively, the material of the quantum dot light emitting layer 3 may also be any one of the quantum dot light emitting diodes of the above embodiments, and is not listed here.

A material of the electron injection layer includes, but is not limited to, any one of lithium fluoride, sodium fluoride, potassium fluoride, rubidium fluoride, cesium fluoride, lithium oxide, and lithium metaborate.

In some embodiments, the base substrate 6 is used as a support for functional layers such as electrodes and the electron transport layer 4 in the QLED device, has good light transmittance in a visible light region and certain capability of preventing moisture and oxygen from passing through the base substrate 6, has good surface smoothness, and may be generally made of glass, or a flexible substrate, or an array substrate or the like. If the flexible substrate is selected, the base substrate 6 may be made of polyester, polyimide or a relatively thin metal.

The embodiment of the present disclosure further provides a method for manufacturing the quantum dot light emitting diode, which is used for manufacturing the QLED device provided by any one of the above embodiments, and the manufacturing method includes: forming a first electrode 1, a second electrode 2, a quantum dot light emitting layer 3, an electron transport layer 4 and an electron buffer layer 5, wherein the quantum dot light emitting layer 3 is provided between the first electrode 1 and the second electrode 2, the electron transport layer 4 is provided between the first electrode 1 and the quantum dot light emitting layer 3, and the electron buffer layer 5 is provided between the electron transport layer 4 and the quantum dot light emitting layer 3; the electron transport layer 4 and the electron buffer layer 5 include the same metal oxide, and an oxygen vacancy concentration in the electron buffer layer 5 is greater than that in the electron transport layer 4.

In the embodiment of the present disclosure, since the electron transport layer and the electron buffer layer include the same metal oxide, the metal oxide thin film for forming the electron buffer layer may be produced by using an existing equipment for forming the electron transport layer. Therefore, an additional equipment specially used for forming the thin film of the electron buffer layer is required to be added in the production line, which is beneficial to reducing the production cost. In addition, the metal oxide thin film for forming the electron transport layer and the metal oxide thin film for forming the electron buffer layer may be formed simultaneously (in the same process), which is beneficial to reducing process steps and simplifying the production process for the QLED device.

Figure 4:
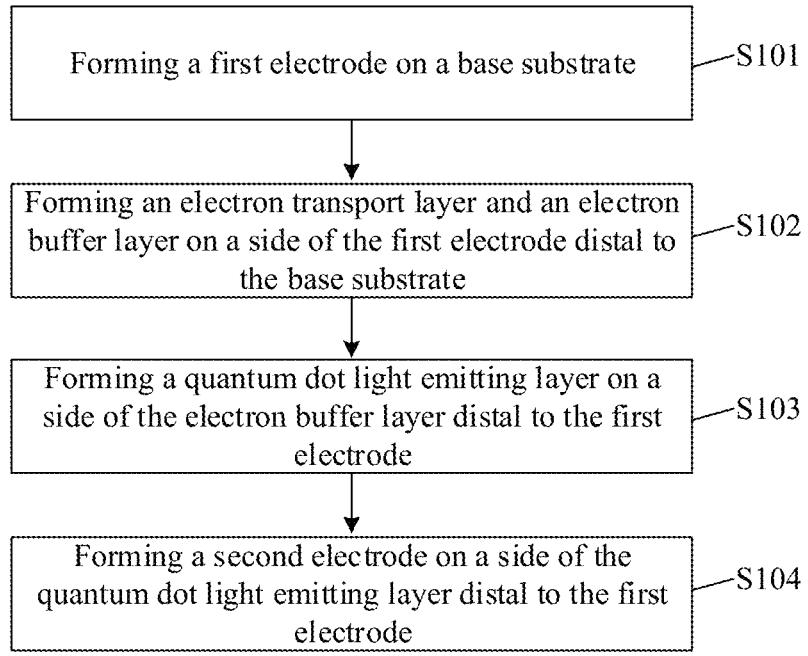
FIG. 4 is a flowchart of a method for manufacturing a quantum dot light emitting diode according to an embodiment of the present disclosure.

FIG. 4 is a flowchart of a method for manufacturing a quantum dot light emitting diode according to an embodiment of the present disclosure. As shown in FIG. 4, the method includes:

Step S101, forming a first electrode on a base substrate.

In step S101, a thin film layer of a conductive material (e.g., a thin film layer of an indium tin oxide material) is formed on the base substrate, and then, a patterning process is performed on the thin film layer of the conductive material to form a pattern of the first electrode.

Step S102, forming an electron transport layer and an electron buffer layer on a side of the first electrode distal to the base substrate.

Figure 5:
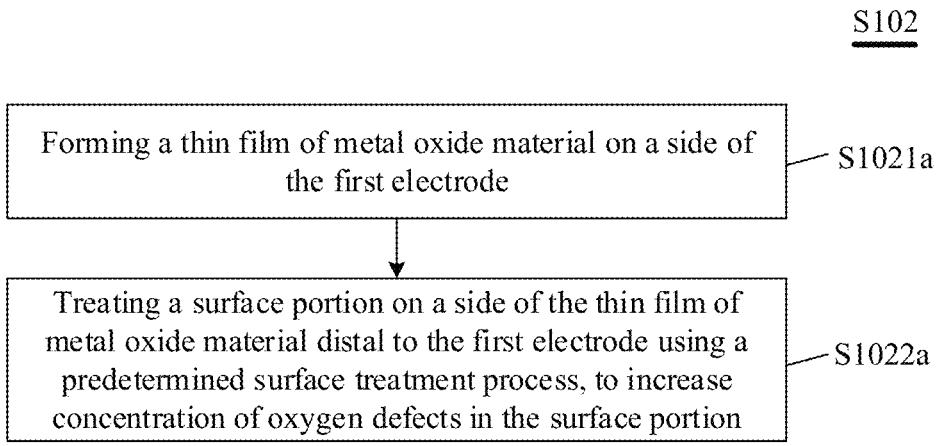
FIG. 5 is a flowchart of an alternative implementation of a method for forming an electron transport layer and an electron buffer layer according to an embodiment of the present disclosure.

FIG. 5 is a flowchart of an alternative implementation of a method for forming an electron transport layer and an electron buffer layer according to an embodiment of the present disclosure. As shown in FIG. 5, the step of forming the electron transport layer and the electron buffer layer includes:

Step S1021a, forming a thin film of metal oxide material on a side of the first electrode.

In step S1021a, the thin film of metal oxide material may be formed by a Physical Vapor Deposition (PVD) process or a solution method.

A case will be exemplarily described as an example where the metal oxide material is zinc oxide, and the solution method is used to form the zinc oxide thin film. First, zinc acetate (approximately 95% in concentration) and ethanolamine (approximately 4% in concentration) were dissolved in 2-methoxyethanol to form a zinc acetate solution (approximately 75 mg/ml in density); then, the zinc acetate solution is spin-coated on the first electrode at a rotation speed of 2000 rpm; subsequently, the base substrate is subjected to an annealing process (approximately 180° C.), and the zinc acetate is decomposed at a high temperature to form the zinc oxide thin film.

The thin film of metal oxide material formed in step S1021a has a crystalline structure. For example, the crystalline structure of the formed zinc oxide thin film is a wurtzite structure, and after analyzing through X-Ray Diffraction (XRD), main characteristic crystal faces appearing on an XRD spectrogram are (100), (002) and (101) crystal faces.

Step S1022a, treating a surface portion on a side of the thin film of metal oxide material distal to the first electrode using a predetermined surface treatment process, to increase the concentration of oxygen defects at the surface portion.

In step S1022a, the surface portion of the thin film of metal oxide material is the electron buffer layer, and a portion of the thin film of metal oxide material that is not treated with the acidic solution is the electron transport layer.

In some embodiments, a weakly acidic solution may be used to treat the surface portion on the side of the thin film of metal oxide material distal to the first electrode. The weakly acidic solution has a PH range including: 4 to 6. In some embodiments, the acidic solution may be weakly organic acids, including, but not limited to, metasilicic acid, hypochlorous acid, formic acid, acetic acid, nitrous acid, sulfurous acid, phenol, and the like.

As an alternative, the thin film of metal oxide material is immersed in the acidic solution for a predetermined period of time, to achieve an increase in the concentration of oxygen defects at the surface portion of the thin film of metal oxide material.

For example, the zinc oxide thin film obtained in S1021a may be immersed in an acetic acid solution (approximately 5% in concentration) for 5 minutes, then taken out from the solution, washed three times with deionized water, and annealed (stably at about 120° C. for about 20 minutes).

It should be noted that, although the specific process of the "predetermined surface treatment process" is not limited in the embodiment of the present disclosure, any process capable of increasing the concentration of oxygen defects at the surface portion on the side of the thin film of metal oxide material distal to the first electrode (the concentration of oxygen defects at the portion of the thin film of metal oxide material proximal to the first electrode is kept constant or substantially constant) is within the protection scope of the present disclosure.

During treating the surface portion on the side of the thin film of metal oxide material distal to the first electrode with the weakly acidic solution, the weakly acidic solution weakens connection sites between the oxide crystals in the surface portion of the thin film of metal oxide material, so that the surface portion of the thin film of metal oxide material changes from the crystalline structure to the non-crystalline structure. Such change is referred to as a physical change. Therefore, there are a large number of oxygen defect sites (also called "oxygen ion vacancy" and "oxygen vacancy") in the surface portion of the thin film of metal oxide material. The oxygen defect sites are used as traps in the electron transport process and may play a role in reducing the electron injection rate between the electron transport layer and the quantum dot light emitting layer.

Based on the above, in the embodiments of the present disclosure, the thin film of metal oxide for forming the electron transport layer and the thin film of metal oxide for forming the electron buffer layer are formed simultaneously (in the same process), which is beneficial to reducing process steps and simplifying the production process of the QLED device.

Figure 6A:
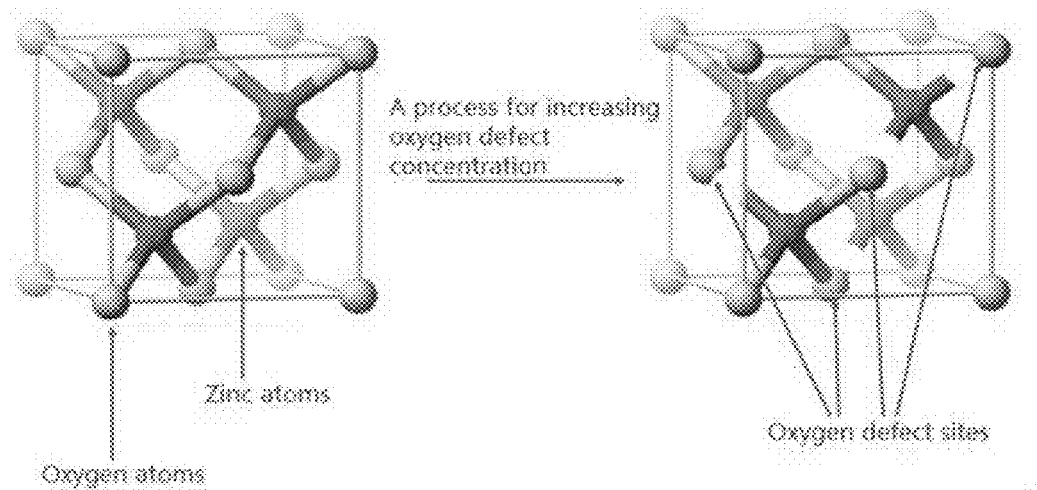
FIG. 6a is a schematic diagram illustrating a surface portion of a thin film of metal oxide material being processed to increase concentration of oxygen defects in the surface portion according to an embodiment of the present disclosure.

FIG. 6a is a schematic diagram illustrating a surface portion of a thin film of metal oxide material being processed to increase the concentration of oxygen defects at the surface portion according to an embodiment of the present disclosure. As shown in FIG. 6a, the metal oxide is taken as zinc oxide as an example. A surface portion of the zinc oxide thin film is treated, so that the number of oxygen defect sites in the surface portion of the zinc oxide thin film is increased; as may be seen from X-ray Photoelectron Spectroscopy (XPS for short), the electron binding energy of oxygen atoms becomes small and shifts toward a side with a low energy; the electron binding energy of the zinc atoms becomes large and shifts toward a side with a high energy. At this time, the surface portion of the zinc oxide thin film is a film layer having the noncrystalline structure (i.e., without any crystal form).

Based on the above, it may be seen that the metal oxide in the electron transport layer formed by the above steps is in the crystalline structure, and the metal oxide in the electron buffer layer is in the noncrystalline structure. The electron binding energy of metal atoms in the metal oxide in the electron transport layer is greater than that of the metal atoms in the metal oxide in the electron buffer layer; the electron binding energy of oxygen atoms in the metal oxide in the electron transport layer is less than that of oxygen atoms in the metal oxide in the electron buffer layer.

Figure 6B:
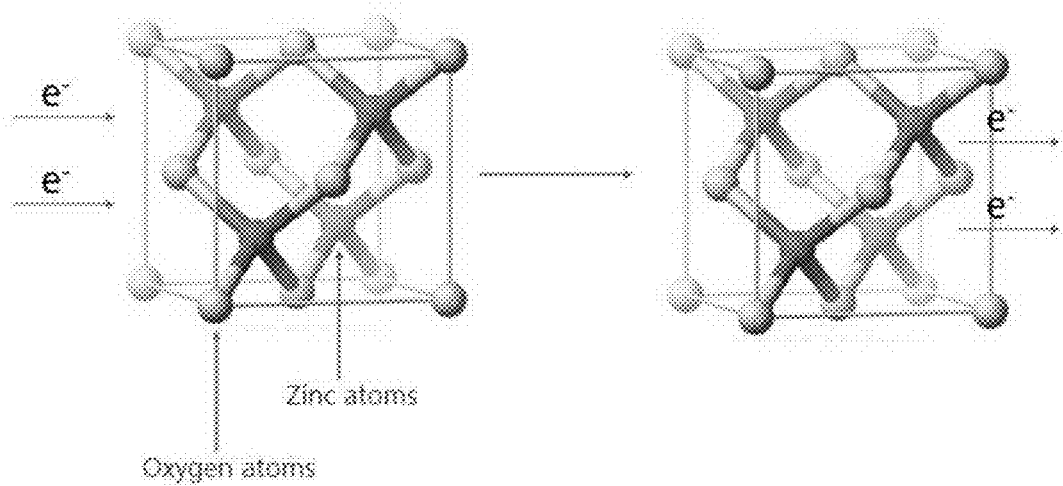
FIG. 6b is a schematic diagram illustrating electrons passing through an electron transport layer according to an embodiment of the present disclosure.
Figure 6C:
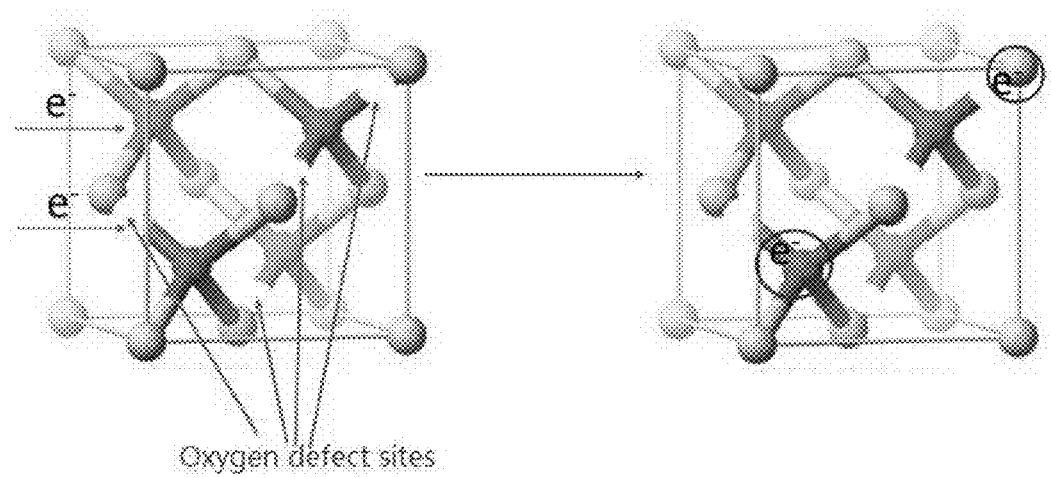
FIG. 6c is a schematic diagram illustrating electrons passing through an electron buffer layer according to an embodiment of the present disclosure.

FIG. 6b is a schematic diagram illustrating electrons passing through an electron transport layer according to an embodiment of the present disclosure; FIG. 6c is a schematic diagram illustrating electrons passing through an electron buffer layer according to an embodiment of the present disclosure. As shown in FIGS. 6b and 6c, when an electron e− passes through the electron transport layer, substantially all of the electrons e− can pass through the electron transport layer rapidly, and the electron transport rate is relatively high. When an electron e− passes through the electron buffer layer, the oxygen vacancy concentration is high, and the oxygen vacancy, which is an electron trap, limits the movement of the electrons e−, so that the electron transport rate in the electron buffer layer is relatively low.

Figure 7:
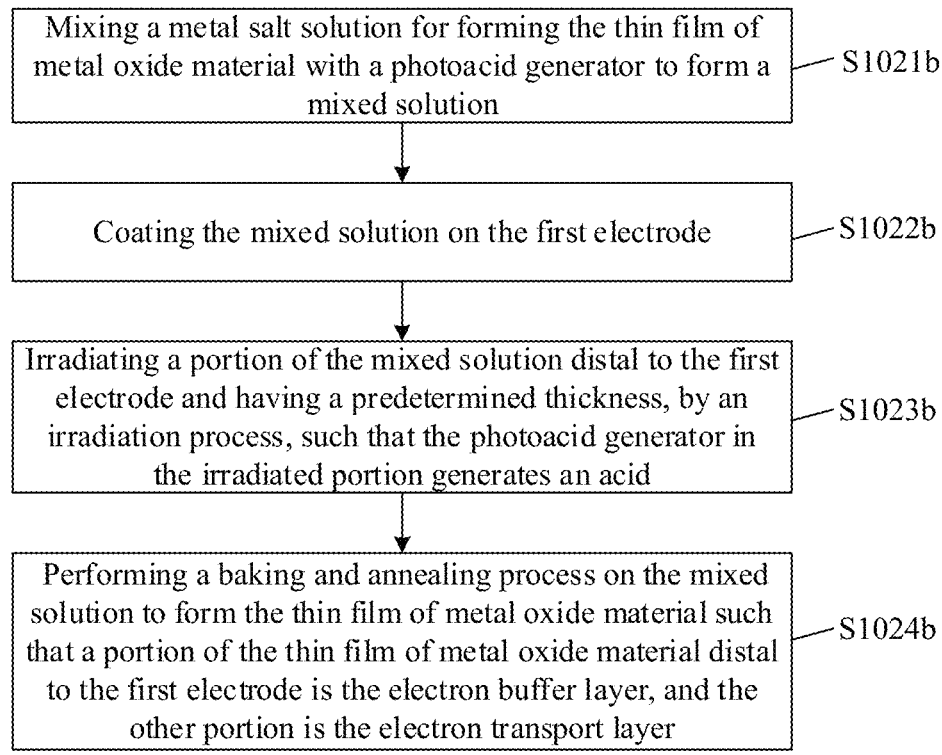
FIG. 7 is a flowchart of an alternative implementation of a method for forming an electron transport layer and an electron buffer layer according to an embodiment of the present disclosure.

FIG. 7 is a flowchart of an alternative implementation of another method for forming an electron transport layer and an electron buffer layer according to an embodiment of the present disclosure. As shown in FIG. 7, the step of forming the electron transport layer and the electron buffer layer includes:

Step S1021b, mixing a metal salt solution for forming the thin film of metal oxide material with a photoacid generator to form a mixed solution.

In the method shown in FIG. 7, the thin film of metal oxide material is formed using the solution method; "a metal salt solution for forming the thin film of metal oxide material" specifically refers to a solution that may be decomposed to obtain a corresponding thin film of metal oxide material after being subjected to a high-temperature annealing process (for example, if a zinc oxide thin film is formed, the corresponding metal salt solution may be a zinc acetate solution, and the zinc acetate may be decomposed to obtain the zinc oxide at a high temperature).

The photoacid generator is a light-sensitive compound that is decomposed under an illumination to produce acids (H+), which act as catalysts to cleave pendant acid labile groups from a polymer during post-exposure baking, and generate new acids.

Step S1022b, coating the mixed solution on the first electrode.

In step S1022b, the mixed solution obtained in step S1021b may be spin-coated on the first electrode by spin coating.

Step S1023b, irradiating a portion of the mixed solution distal to the first electrode and having a predetermined thickness, by an irradiation process, so that the photoacid generator in the irradiated portion generates an acid.

In step S1023b, the mixed solution is irradiated from a side of the mixed solution distal to the first electrode, and an irradiated depth of the mixed solution may be set according to actual requirement, so as to ensure that the portion of the mixed solution distal to the first electrode and having the predetermined thickness is irradiated, and a portion of the mixed solution proximal to the first electrode is not irradiated. At this time, the photoacid generator in the irradiated portion generates the acid, while the photoacid generator in the non-irradiated portion does not generate the acid.

Step S1024b, performing a baking and annealing process on the mixed solution to form the thin film of metal oxide material; the portion of the thin film of metal oxide material distal to the first electrode is the electron buffer layer, and the other portion is the electron transport layer.

In step S1024b, the baking and annealing process is performed on the mixed solution, and the metal salt in the mixed solution is decomposed to obtain the metal oxide. The portion distal to the first electrode in the mixed solution contains acid which may weaken the connection sites among oxide crystals, so that the oxygen vacancy concentration of the portion distal to the first electrode (i.e., the electron buffer layer) in the finally obtained thin film of metal oxide material is greater than that of the portion proximal to the first electrode (i.e., the electron transport layer).

Based on the above, it may be seen that in the embodiments of the present disclosure, the metal oxide thin film for forming the electron transport layer and the metal oxide thin film for forming the electron buffer layer are formed simultaneously (in the same process), which is beneficial to reducing process steps and simplifying the production process of the QLED device.

Step S103, forming the quantum dot light emitting layer on a side of the electron buffer layer distal to the first electrode.

In step S103, as an example where the quantum dot light emitting layer includes a perovskite type quantum dot light emitting layer, the step of forming the perovskite type quantum dot light emitting layer includes: firstly, spin-coating a solution (chloroform, toluene, n-hexane, n-octane, or n-heptane or the like) having a low boiling point and containing the perovskite quantum dots on the electron buffer layer at a rotation speed of 2500 rpm; then, performing a drying and forming-film (the drying temperature is between 80 and 120° C.) to form the quantum dot light emitting layer.

Step S104, forming a second electrode on a side of the quantum dot light emitting layer distal to the first electrode.

A conductive material may be formed by vapor-depositing, sputtering, or the like (e.g., a vapor-deposited aluminum film, a silver film, or a sputtered indium zinc oxide) in step S104 to form the second electrode.

Through the steps S101 to S104, an inverted QLED device may be manufactured, that is, a distance between the cathode (first electrode) and the base substrate is greater than a distance between the anode (second electrode) and the base substrate.

In some embodiments, a step of sequentially forming the hole transport layer and the hole injection layer is included between step S103 and step S104. After the step of forming the hole injection layer is completed, the second electrode is formed.

Figure 8:
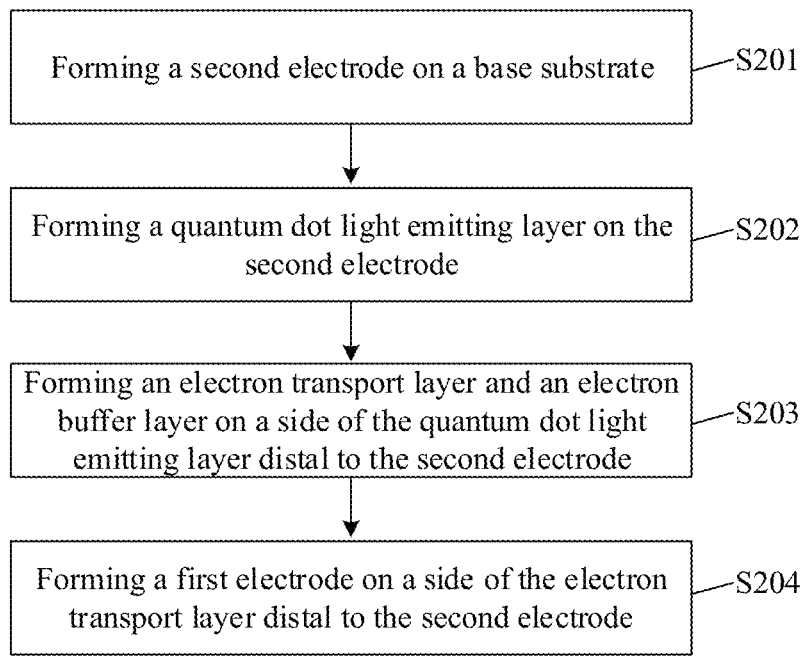
FIG. 8 is a flowchart of a method for manufacturing a quantum dot light emitting diode according to an embodiment of the present disclosure.

FIG. 8 is a flowchart of another method for manufacturing a quantum dot light emitting diode according to an embodiment of the present disclosure. As shown in FIG. 8, the method includes:

Step S201, forming a second electrode on a base substrate.

Step S202, forming a quantum dot light emitting layer on the second electrode.

For the description of step S201 and step S202, reference may be made to the previous description of step S104 and step S103.

Step 203, forming an electron transport layer and an electron buffer layer on a side of the quantum dot light emitting layer distal to the second electrode, wherein the electron transport layer is provided on a side of the electron buffer layer distal to the first electrode.

Figure 9:
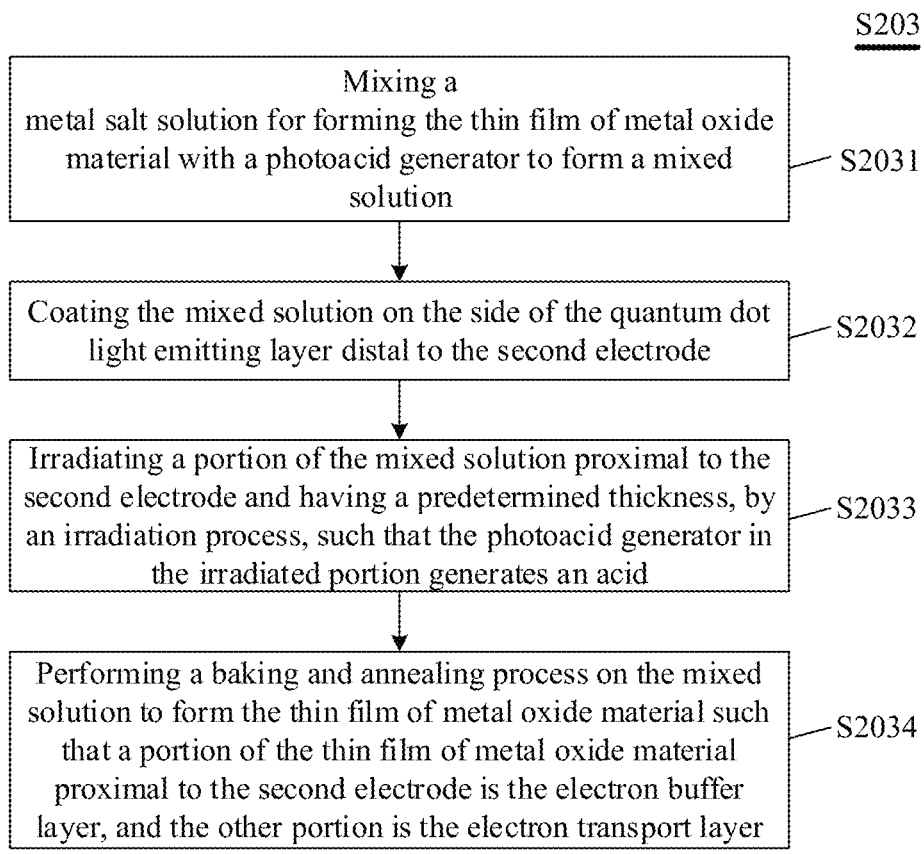
FIG. 9 is a flowchart of an alternative implementation of a method for forming an electron transport layer and an electron buffer layer according to an embodiment of the present disclosure.

FIG. 9 is a flowchart of an alternative implementation of yet another method for forming an electron transport layer and an electron buffer layer according to an embodiment of the present disclosure. As shown in FIG. 9, the step of forming the electron transport layer and the electron buffer layer includes:

Step S2031, mixing a metal salt solution for forming the thin film of metal oxide material with a photoacid generator to form a mixed solution.

Step S2032, coating the mixed solution on the side of the quantum dot light emitting layer distal to the second electrode.

For the description of step S2031 and step S1032, reference may be made to the previous description of step S1021b and step S1022b.

Step S2033, irradiating a portion of the mixed solution proximal to the second electrode and having a predetermined thickness, by an irradiation process, so that the photoacid generator in the irradiated portion generates an acid.

Unlike the previous step S1023b, in this embodiment, the mixed solution is irradiated from a side of the base substrate distal to the second electrode, and an irradiated depth of the mixed solution may be set according to actual requirement, so as to ensure that the portion of the mixed solution proximal to the second electrode and having the predetermined thickness is irradiated, and a portion of the mixed solution distal to the second electrode is not irradiated. At this time, the photoacid generator in the irradiated portion generates the acid, while the photoacid generator in the non-irradiated portion does not generate the acid.

Step S2034, performing a baking and annealing process on the mixed solution to form the thin film of metal oxide material; the portion of the thin film of metal oxide material proximal to the second electrode is the electron buffer layer, and the other portion is the electron transport layer.

In step S2034, the baking and annealing process is performed on the mixed solution, and the metal salt in the mixed solution is decomposed to obtain the metal oxide. The portion proximal to the second electrode in the mixed solution contains acid which may weaken the connection sites among oxide crystals, so that the oxygen vacancy concentration of the portion proximal to the second electrode (i.e., the electron buffer layer) in the finally obtained thin film of metal oxide material is greater than that of the portion distal to the second electrode (i.e., the electron transport layer).

Step S204, forming a first electrode on a side of the electron transport layer distal to the second electrode.

Based on the above, it may be seen that in the embodiments of the present disclosure, the metal oxide thin film for forming the electron transport layer and the metal oxide thin film for forming the electron buffer layer are formed simultaneously (in the same process), which is beneficial to reducing process steps and simplifying the production process of the QLED device.

Through the steps S201 to S204, the upright QLED device may be manufactured, that is, a distance between the anode (second electrode) and the base substrate is greater than a distance between the cathode (first electrode) and the base substrate In some embodiments, a step of sequentially forming a hole injection layer and a hole transport layer is included between the steps S201 and S202. After the step of forming the hole transport layer is completed, the quantum dot light emitting layer is formed.

The embodiment of the present disclosure provides a display apparatus, which includes the quantum dot light emitting diode provided by any one of the foregoing embodiments, and the quantum dot light emitting diode may be manufactured by any one of the manufacturing methods. For the specific description of the quantum dot light emitting diode and the manufacturing method thereof, reference may be made to the corresponding contents in the foregoing embodiments, and details are not repeated here.

The display apparatus may be any product or component with a display function, such as a television, a digital camera, a mobile phone, a tablet computer and the like.

It will be understood that the above embodiments are merely exemplary embodiments employed to illustrate the principles of the present disclosure. However, the present disclosure is not limited thereto. It will be apparent to one of ordinary skill in the art that various changes and modifications may be made therein without departing from the spirit and scope of the present disclosure, and these changes and modifications are to be considered within the scope of the present disclosure.

What is claimed is:

1. A method for manufacturing a quantum dot light emitting diode, comprising: forming a first electrode, a second electrode, a quantum dot light emitting layer, an electron transport layer and an electron buffer layer, wherein the quantum dot light emitting layer is provided between the first electrode and the second electrode, the electron transport layer is provided between the first electrode and the quantum dot light emitting layer, and the electron buffer layer is provided between the electron transport layer and the quantum dot light emitting layer;

wherein the electron transport layer and the electron buffer layer comprise a same metal oxide, and an oxygen vacancy concentration in the electron buffer layer is greater than that in the electron transport layer;

wherein the forming the electron transport layer and the electron buffer layer comprises one of the following two processes:

one process is:

forming a thin film of metal oxide material on a side of the first electrode;

treating a surface portion on a side of the thin film of metal oxide material distal to the first electrode using a predetermined surface treatment process to increase a concentration of oxygen defects in the surface portion such that the surface portion is the electron buffer layer, and a portion of the thin film of metal oxide material, which is not treated, is the electron transport layer;

the other one process is:

mixing a metal salt solution for forming a thin film of metal oxide material with a photoacid generator to form a mixed solution;

coating the mixed solution on the first electrode;

irradiating a portion of the mixed solution distal to the first electrode and having a predetermined thickness, by an irradiation process, such that the photoacid generator in the irradiated portion generates an acid; and performing a baking and annealing process on the mixed solution to form the thin film of metal oxide material such that a portion of the thin film of metal oxide material distal to the first electrode is the electron buffer layer, and the other portion is the electron transport layer.

2. The method of claim 1, wherein the forming the first electrode, the second electrode, the quantum dot light emitting layer, the electron transport layer and the electron buffer layer comprises:

forming the first electrode;

forming the electron transport layer and the electron buffer layer on the side of the first electrode such that the electron buffer layer is provided on a side of the electron transport layer distal to the first electrode;

forming the quantum dot light emitting layer on a side of the electron buffer layer distal to the first electrode; and forming the second electrode on a side of the quantum dot light emitting layer distal to the first electrode.

3. The method of claim 1, wherein the treating the surface portion on the side of the thin film of metal oxide material distal to the first electrode using the predetermined surface treatment process comprises:

treating the surface portion on the side of the thin film of metal oxide material distal to the first electrode with an acidic solution having a pH range comprising: 4 to 6.

4. The method of claim 3, wherein the treating the surface portion on the side of the thin film of metal oxide material distal to the first electrode with the acidic solution comprises:

immersing the thin film of metal oxide material in the acidic solution for a predetermined period of time.

5. A method for manufacturing a quantum dot light emitting diode, comprising: forming a first electrode, a second electrode, a quantum dot light emitting layer, an electron transport layer and an electron buffer layer, wherein the quantum dot light emitting layer is provided between the first electrode and the second electrode, the electron transport layer is provided between the first electrode and the quantum dot light emitting layer, and the electron buffer layer is provided between the electron transport layer and the quantum dot light emitting layer;

wherein the electron transport layer and the electron buffer layer comprise a same metal oxide, and an oxygen vacancy concentration in the electron buffer layer is greater than that in the electron transport layer;

wherein the forming the first electrode, the second electrode, the quantum dot light emitting layer, the electron transport layer and the electron buffer layer comprises:

forming the second electrode;

forming the quantum dot light emitting layer on the second electrode;

forming the electron transport layer and the electron buffer layer on a side of the quantum dot light emitting layer distal to the second electrode such that the electron transport layer is provided on a side of the electron buffer layer distal to the second electrode; and forming the first electrode on a side of the electron transport layer distal to the second electrode;

wherein the forming the electron transport layer and the electron buffer layer on the side of the quantum dot light emitting layer distal to the second electrode comprises:

mixing a metal salt solution for forming the thin film of metal oxide material with a photoacid generator to form a mixed solution;

coating the mixed solution on the side of the quantum dot light emitting layer distal to the second electrode;

irradiating a portion of the mixed solution proximal to the second electrode and having a predetermined thickness, by an irradiation process, such that the photoacid generator in the irradiated portion generates an acid; and performing a baking and annealing process on the mixed solution to form the thin film of metal oxide material such that the portion of the thin film of metal oxide material proximal to the second electrode is the electron buffer layer, and the other portion is the electron transport layer.

* * * * *